(12) United States Patent
Dan et al.

(10) Patent No.: US 10,725,110 B2
(45) Date of Patent: Jul. 28, 2020

(54) CURRENT DETECTION SYSTEM, METHOD AND DEVICE

(71) Applicant: Contemporary Amperex Technology Co., Limited, Ningde, Fujian (CN)

(72) Inventors: Zhimin Dan, Ningde (CN); Wei Zhang, Ningde (CN); Yizhen Hou, Ningde (CN); Jia Xu, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 83 days.

(21) Appl. No.: 16/165,811

(22) Filed: Oct. 19, 2018

(65) Prior Publication Data

US 2019/0120906 A1    Apr. 25, 2019

(30) Foreign Application Priority Data

Oct. 23, 2017    (CN) .......................... 2017 1 0992501

(51) Int. Cl.
| | | |
|---|---|---|
| *G01R 31/36* | (2020.01) | |
| *G01R 15/20* | (2006.01) | |
| *G01R 1/20* | (2006.01) | |
| *G01R 15/14* | (2006.01) | |
| *G01R 19/00* | (2006.01) | |

(52) U.S. Cl.
CPC ......... *G01R 31/3648* (2013.01); *G01R 1/203* (2013.01); *G01R 15/146* (2013.01); *G01R 15/202* (2013.01); *G01R 19/0092* (2013.01)

(58) Field of Classification Search
CPC .. G01R 31/3648; G01R 1/203; G01R 15/202; G01R 19/0092; G01R 15/146

USPC ... 324/207.13–207.15, 200, 86, 167, 207.25, 324/654, 76.75, 76.11, 437, 500, 750.16, 324/220

See application file for complete search history.

(56) References Cited

U.S. PATENT DOCUMENTS

2012/0282500 A1*  11/2012  Tzivanopoulos ... H01M 10/482
                                                                   429/61
2017/0021440 A1*   1/2017  Balaster .................. B23K 9/124

FOREIGN PATENT DOCUMENTS

| CN | 102854372 A  | 1/2013  |
|----|--------------|---------|
| CN | 203365535 U  | 12/2013 |
| CN | 104142416 A  | 11/2014 |
| CN | 204367903 U  | 6/2015  |
| CN | 105730274 A  | 7/2016  |
| CN | 105738819 A  | 7/2016  |
| CN | 107037376 A  | 8/2017  |
| CN | 206515387 U  | 9/2017  |

(Continued)

OTHER PUBLICATIONS

The extended European search report dated Apr. 9, 2019 for European application No. 18202083.4, 8 pages.

(Continued)

*Primary Examiner* — Melissa J Koval
*Assistant Examiner* — Trung Nguyen
(74) *Attorney, Agent, or Firm* — Law Offices of Liaoteng Wang

(57) ABSTRACT

The present disclosure provides a current detection system, method and device. The current detection system includes a management unit and a current detection device that is connected with the management unit. The current detection device includes a shunt-type current measurement unit, an open-loop Hall-type current measurement unit and an isolation power unit.

12 Claims, 6 Drawing Sheets

(56) References Cited

FOREIGN PATENT DOCUMENTS

| DE | 102009046564 A1 | 5/2011 |
|---|---|---|
| JP | 2009281773 A | 12/2009 |
| KR | 20160111166 A | 9/2016 |

OTHER PUBLICATIONS

The first Office Action and Search Report for Chinese Application No. 201710992501.6, dated Aug. 28, 2019, 17pages.

* cited by examiner

CURRENT DETECTION SYSTEM, METHOD AND DEVICE

CROSS-REFERENCE TO RELATED APPLICATION

This application is based upon and claims priority to Chinese Patent Application No. 201710992501.6, filed on Oct. 23, 2017, the content of which is incorporated herein by reference in its entirety.

FIELD

The present disclosure relates to the field of battery technology, and more particularly to a current detection system, method and device.

BACKGROUND

In recent years, an electric vehicle has a very good prospect and becomes the trend of industrial development because it can reduce greenhouse gas emissions, promote sustainable energy development and improve air quality. A power battery pack is responsible for storing and supplying electric energy and is a core part of the electric vehicle.

A Battery Management System (BMS) is an important link for connecting the power battery pack to the electric vehicle. The BMS plays a very important role in extending a service life of the power battery pack and maintaining the performance of the power battery pack.

During a charging or discharging process of the power battery pack, the State of Charge (SOC) of the power battery pack is an important parameter in the control of the electric vehicle. A calculation precision of the SOC will directly affect the mileage and service life of the electric vehicle. Therefore, the BMS needs to accurately estimate the SOC of the power battery pack.

The SOC of the power battery pack can be calculated by an ampere-hour integration method. This method of calculating the SOC may detect a current value of the power battery pack in real time and make a cumulative calculation with a specific algorithm, so as to measure the SOC of the power battery pack according to a cumulative result during a period of time. Therefore, the accuracy of the current detection for the power battery pack will directly affect the calculation result of the SOC.

Generally, the current value of the power battery pack can be acquired by a shunt-type current sensor. However, when the shunt-type current sensor fails, the current value of the power battery pack cannot be acquired and the cause of the fault cannot be determined, which results in a low reliability of the current detection.

SUMMARY

According to an aspect of the present disclosure, a current detection system is provided and includes a management unit and a current detection device that is connected with the management unit, wherein the current detection device includes a shunt-type current measurement unit, an open-loop Hall-type current measurement unit and an isolation power unit; the shunt-type current measurement unit is configured to measure a current value of a power battery pack with a current sensing device having a shunt resistor; the open-loop Hall-type current measurement unit is configured to measure a current value of the power battery pack with a current sensing device having a magnetic field sensitive element; the isolation power unit is configured to electrically isolate a power supply provided by the management unit and convert a voltage from the power supply into operating voltages of the shunt-type current measurement unit and the open-loop Hall-type current measurement unit; and the management unit is configured to receive the current value measured by the current sensing device having the shunt resistor and the current value measured by the current sensing device having the magnetic field sensitive element, and perform a fault detection on the current detection device.

According to another aspect of the present disclosure, a current detection method is provided and includes determining whether a shunt sensor report data is detected, wherein the shunt sensor report data is a current value measured by a current sensing device having a shunt resistor; determining whether a Hall sensor report data is detected, wherein the Hall sensor report data is a current value measured by a current sensing device having a magnetic field sensitive element; determining that a current detection device is in a fault state and a fault type of the current detection device is a power fault when neither the shunt sensor report data nor the Hall sensor report data is detected, wherein the current detection device includes the current sensing device having the shunt resistor and the current sensing device having the magnetic field sensitive element; and determining accepted report data from the detected report data according to the shunt sensor report data, the Hall sensor report data and acquired state information of a vehicle, when the detected report data includes the shunt sensor report data and the Hall sensor report data.

According to yet another aspect of the present disclosure, a current detection device is provided and includes a shunt-type current measurement unit, an open-loop Hall-type current measurement unit, an isolation power unit and an interface unit, wherein the interface unit includes a power interface, a Controller Area Network CAN interface and an analog interface; the shunt-type current measurement unit is configured to measure a current value of a power battery pack with a current sensing device having a shunt resistor and transmit the current value as measured by the current sensing device having the shunt resistor to the CAN interface; the open-loop Hall-type current measurement unit is configured to measure the current value of the power battery pack with a current sensing device having a magnetic field sensitive element and transmit the current value as measured by the current sensing device having the magnetic field sensitive element to the analog interface; and the isolation power unit is configured to electrically isolate an input power from the power interface and convert a voltage supplied by the input power into operating voltages of the shunt-type current measurement unit and the open-loop Hall-type current measurement unit.

BRIEF DESCRIPTION OF THE DRAWINGS

To more clearly illustrate technical solutions of embodiments of the present disclosure, the accompanying drawings, which are to be referred by the embodiments of the present disclosure, will be briefly described. Those skilled in the art will be able to obtain additional drawings in accordance with these drawings without any creative work.

DETAILED DESCRIPTION

Various aspects of features and exemplary embodiments of the present disclosure will be described in detail below. The present disclosure will be provided in further detail below in conjunction with accompanying drawings and embodiments in order to make objects, technical solutions and advantages of the present disclosure to be more clearly understood. It is to be appreciated that the specific embodiments described herein are to be construed to illustrate the present disclosure but not to limit the present disclosure. It will be apparent to those skilled in the art that the present disclosure may be practiced without some of these specific details. The following description of the embodiments is merely to provide a better understanding of the present disclosure by illustrating examples thereof.

It is to be noted that relational terms such as first, second and the like are used herein only to distinguish an entity or operation from another entity or operation without requiring or implying that there is any such actual relationship or order between these entities or operations. Moreover, the term "comprise", "include" or any other variant thereof is intended to encompass a non-exclusive inclusion, such that a process, method, article or device that includes a series of elements includes not only these elements but also other elements that are not explicitly listed or those elements that are inherent to such a process, method, article or device. In the absence of more restrictions, elements defined by the statement "includes . . . " do not preclude the presence of additional identical elements in the process, method, article or device that includes the elements.

For a better understanding of the present disclosure, a current detection system, method and device according to embodiments of the present disclosure will be described in detail with reference to the accompanying drawings. It is to be noted that these embodiments are not intended to limit the scope of the present disclosure.

Figure 1:
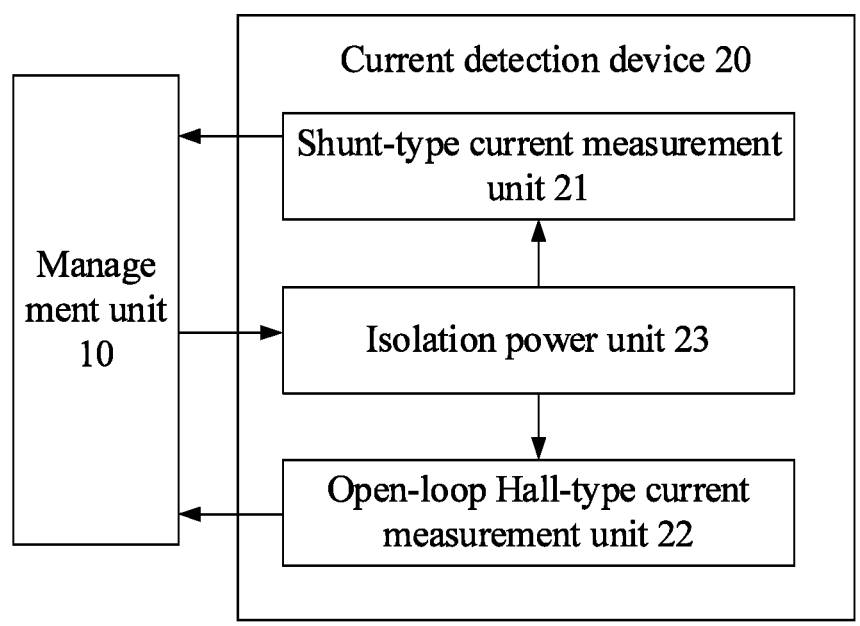
FIG. 1 is a schematic block diagram of a current detection system according to an embodiment of the present disclosure.

FIG. 1 is a schematic block diagram of a current detection system according to an embodiment of the present disclosure. As shown in FIG. 1, the current detection system 100 according to the embodiment of the present disclosure may include a management unit 10 and a current detection device 20 that is connected with the management unit 10.

The current detection device 20 may include a shunt-type current measurement unit 21, an open-loop Hall-type current measurement unit 22 and an isolation power unit 23.

The shunt-type current measurement unit 21 may be configured to measure a current value of a power battery pack with a current sensing device having a shunt resistor. The open-loop Hall-type current measurement unit 22 may be configured to measure the current value of the power battery pack with a current sensing device having a magnetic field sensitive element. The isolation power unit 23 may be configured to electrically isolate an input power and convert a voltage from a power supply provided by the management unit into operating voltages of the shunt-type current measurement unit 21 and the open-loop Hall-type current measurement unit 22.

The management unit 10 may be configured to receive the current value measured by the current sensing device having the shunt resistor and the current value measured by the current sensing device having the magnetic field sensitive element, and perform a fault detection on the current detection device.

In the embodiment, both the shunt-type current measurement unit and the open-loop Hall-type current measurement unit adopt a modular design, and the two current measurement units are independent from each other. Under normal conditions, the measured current data may be reported by the shunt-type current measurement unit 21 to achieve a precise measurement of the current. When the shunt-type current measurement unit 21 fails, the current data may be reported by the open-loop Hall-type current measurement unit 22 and applied to diagnose the fault that occurs in the shunt-type current measurement unit 21, thereby improving the reliability of the current detection process.

Figure 2:
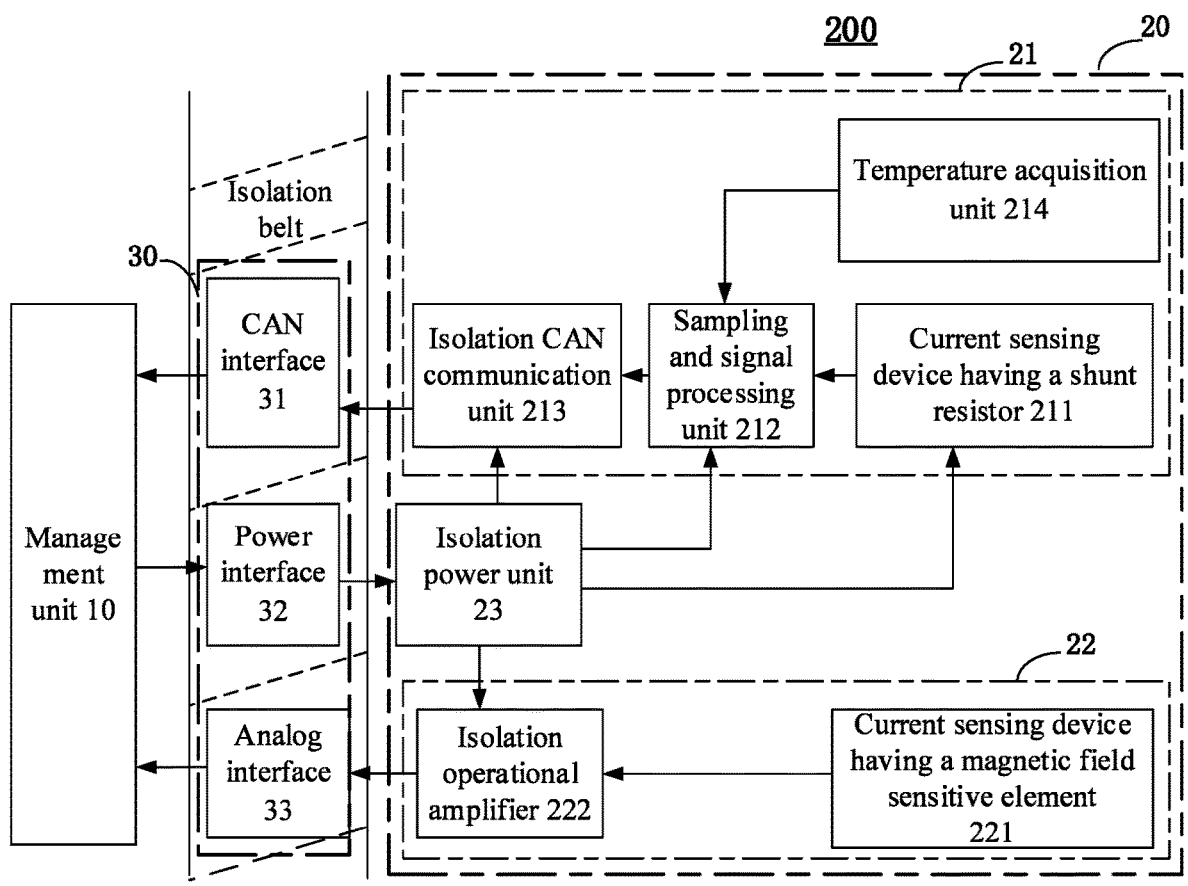
FIG. 2 is a schematic block diagram of a current detection system according to another embodiment of the present disclosure.

FIG. 2 is a schematic block diagram of a current detection system according to another embodiment of the present disclosure. The same or equivalent components in FIG. 2 as those in FIG. 1 are denoted by the same reference numerals. Next, a current detection system according to an exemplary embodiment of the present disclosure will be described in detail with reference to FIG. 2.

As shown in FIG. 2, the current detection system 200 may include a management unit 10, a current detection device 20 and an interface unit 30. A shunt-type current measurement unit 21 in the current detection device 20 may particularly include a current sensing device 211 having a shunt resistor, a sampling and signal processing device 212, an isolation CAN (Controller Area Network) communication unit 213 and a temperature acquisition unit 214. An open-loop Hall-type current measurement unit 22 in the current detection device 20 may particularly include a current sensing device 221 having a magnetic field sensitive element and an isolation operational amplifier 222. The interface unit 30 may particularly include a CAN interface 31, a power interface 32, and an analog interface 33.

However, the present disclosure is not limited to the specific units as described above and shown in FIG. 2. In some embodiments, the current detection system 200 may include only some of the units. That is, the current detection system 200 may include a more flexible unit configuration, which will be described in conjunction with the following specific embodiments.

In an embodiment of the present disclosure, the shunt-type current measurement unit 21 includes a current sensing device 211 having a shunt resistor, a sampling and signal processing device 212, and an isolation CAN communication unit 213.

The current sensing device 211 having the shunt resistor may be configured to acquire a voltage signal of the power battery pack and output the voltage signal via a signal terminal of the current sensing device 211 having the shunt resistor.

The sampling and signal processing device 212 may be configured to acquire the voltage signal and use the voltage signal and a resistance value of the shunt resistor to calculate the current value of the power battery pack.

In the embodiment of the present disclosure, the shunt-type current measurement unit 21 may adopt a Controller Area Network (CAN) communication method with high reliability.

The isolation CAN communication unit 213 may be configured to electrically isolate the current sensing device 211 having the shunt resistor and the sampling and signal processing device 212, convert the calculated current value of the power battery pack into a current value that conforms to the CAN specification, and transmit the current data that conforms to the CAN specification to the CAN interface via a CAN bus. The CAN interface may include a CAN high-voltage line interface and a CAN low-voltage line interface.

With continued reference to FIG. 2, in an embodiment, the current detection system 200 may further include the CAN interface 31 for outputting the current data on the CAN bus in a manner of differential signal transmission through the CAN high-voltage line interface CANH and the CAN low-voltage line interface CANL.

In the embodiment of the present disclosure, a full-range and high-accuracy current measurement may be realized by using the current sensing device having the shunt resistor. Further, the communication with the management unit may be implemented through the CAN bus, which has the advantages of fast transmission speed and strong anti-interference capability. Therefore, the shunt-type current measurement unit can be used as a main unit for current measurement of the current detection system.

In order to increase the measurement accuracy and reduce the influence of very high temperature or very low temperature on the current sensing device having the shunt resistor, in an embodiment, as shown in FIG. 2, the shunt-type current measurement unit may further include the temperature acquisition unit 214. In an embodiment, the temperature acquisition unit 214 may include a thermistor.

In an embodiment, the thermistor can be classified into a positive temperature coefficient thermistor and a negative temperature coefficient thermistor dependent on the temperature coefficient. The typical characteristic of the thermistor is sensitive to temperature and has different resistance values under different temperatures.

Specifically, the temperature acquisition unit 214 may be configured to detect a temperature value of the current sensing device 211 having the shunt resistor by utilizing the characteristic of the thermistor having a resistance value that may change with temperature. The management unit 10 may be further configured to receive the detected temperature value and perform temperature compensation for the current sensing device having the shunt resistor based on the temperature value.

In the embodiment, the temperature acquisition unit 214 may be separated from the current sensing device 211 having the shunt resistor. The thermistor may be disposed at a position close to the shunt-type current sensing device but not in contact with the shunt-type current sensing device. When the temperature of the shunt-type current sensing device is increased or decreased, the thermistor may be affected by the changed temperature to have a changed resistance value. Based on a pre-established curve showing the change of the resistance value of the thermistor versus temperature, the value of temperature change corresponding to the change of the resistance value can be obtained. The obtained value of temperature change is the value of temperature change of the shunt-type current sensing device.

In another embodiment of the present disclosure, as shown in FIG. 2, the open-loop Hall-type current measurement unit 22 may include the current sensing device 221 having the magnetic field sensitive element and the isolation operational amplifier 222.

In the embodiment, the current sensing device 221 having the magnetic field sensitive element may be used to measure a current signal of the power battery pack with the magnetic field sensitive element. The isolation operational amplifier 222 may be configured to electrically isolate the current sensing device having the magnetic field sensitive element, and amplify the current signal measured by the magnetic field sensitive element by use of a measurement amplifier circuit.

In an embodiment, as shown in FIG. 2, the current detection system 200 may further include the power interface 32. The power interface 32 may include a low-voltage DC power interface and a low-voltage ground interface. The low-voltage DC power interface may be used to output a low-voltage DC power to the isolation power unit 23. The low-voltage ground interface may be used to ground each unit in the shunt-type current measurement unit 21, each unit in the open-loop Hall-type current measurement unit 22 and the isolation power unit at a low voltage.

In an embodiment, the management unit may be a battery management unit BMU. The management unit may provide a low-voltage DC power through the power interface 32. A side of the power interface 32 and the management unit may be referred to as a low-voltage side.

In an embodiment, the shunt-type current measurement unit 21 and the open-loop Hall-type current measurement unit 22 usually perform current detection on a load in a power system. The same side of the interface unit and the current detection may be understood as a high-voltage side. In order to avoid signal interference between the high-voltage side and the low-voltage side and allow the system to work normally, it is necessary to implement an electrical isolation between the low-voltage side and the high-voltage side.

In an embodiment, as shown in FIG. 2, the isolation CAN communication unit 213, the isolation power unit 23 and the isolation operational amplifier 222 may each provide the electrical isolation between high and low voltages. Thus the isolation CAN communication unit 213, the isolation power unit 23 and the isolation operational amplifier 222 may form an isolation belt to isolate high and low voltages on the high-voltage side of the current detection system.

Figure 3:
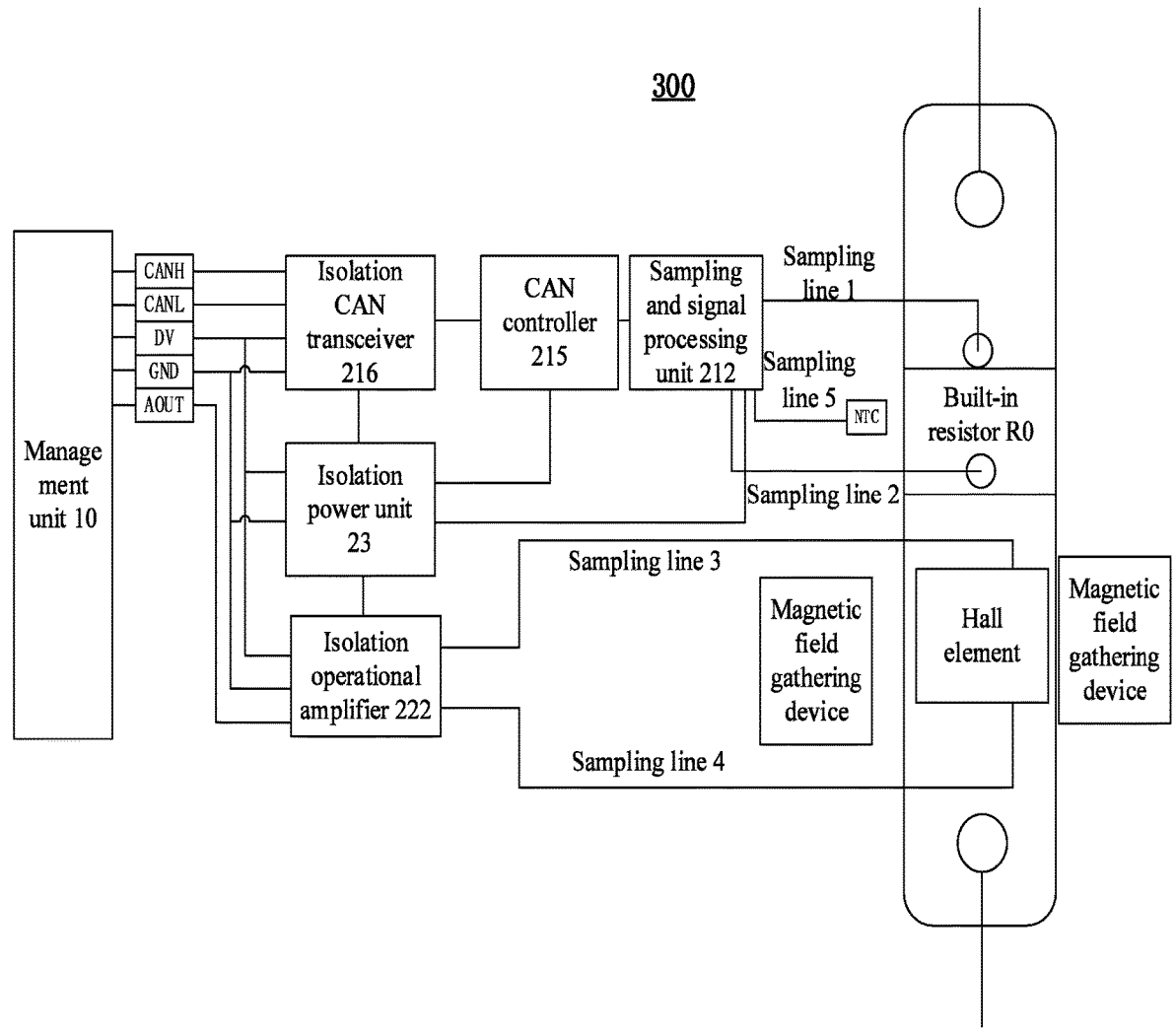
FIG. 3 is a schematic circuit diagram of a current detection system according to an embodiment of the present disclosure.

FIG. 3 is a schematic circuit diagram of a current detection system according to another embodiment of the present disclosure. The same or equivalent units in FIG. 3 as those in FIG. 2 are denoted by the same reference numerals.

As shown in FIG. 3, the current sensing device 211 having the shunt resistor may be a shunt having two sets of terminal knobs on the terminals at both ends of the shunt.

Specifically, a set of two potential terminal knobs may be provided on the outside of the shunt and respectively connected to a positive terminal and a negative terminal of a power battery pack to be detected; a set of two signal terminal knobs may be provided on the inside of the shunt and respectively connected to the sampling and signal processing unit 212 through a sampling line Sampling1 and a sampling line Sampling2.

Specifically, the shunt may include a built-in resistor $R_0$. When a DC current passes, there is a voltage drop across the $R_0$. Sampling1 is a sampling line at one end of the built-in resistor $R_0$, while Sampling2 is a sampling line at the other end of the resistor $R_0$. The sampling and signal processing unit 212 may acquire the voltage drop across the built-in resistor $R_0$ of the shunt through the sampling line Sampling1 and the sampling line Sampling2, and calculate the current flowing through the shunt according to the following formula (1):

$$I_{shunt} = \frac{|U_{SP1} - U_{sp2}|}{R_0} \qquad (1)$$

In the above formula (1), $U_{SP1}$ represents a sampled voltage at one end of the built-in resistor $R_0$ acquired through the sampling line Sampling1, and $U_{SP2}$ represents a sampled voltage at the other end of the built-in resistor $R_0$ acquired through the sampling line Sampling2. The absolute value of the difference between the sampled voltage $U_{SP1}$ and the sampled voltage $U_{SP2}$ is obtained as the voltage drop across the built-in resistor $R_0$, and then the voltage drop across the built-in resistor $R_0$ is divided by the resistance value of the built-in resistor $R_0$ to obtain the current $I_{shunt}$ detected by the shunt.

In the embodiment, the sampling and signal processing unit 212 may input the current value of the power battery pack to be detected as calculated according to the above formula (1) to the isolation CAN communication unit 213.

Particularly, as shown in FIG. 3, the isolation CAN communication unit may include a CAN controller 215 and an isolation CAN transceiver 216. The CAN controller 215 may convert the current data to be transmitted or received into a CAN frame conforming to the CAN specification, and then exchange information with the management unit 10 on the CAN bus via the CAN transceiver. The CANH terminal can be in a high level or suspended state, while the CANL terminal can be in a low level or suspended state. Thus, with the CANH terminal and CANL terminal, a differential voltage can be formed on two buses. By utilizing the two buses with the differential voltage to transmit the current value acquired by the shunt, it is possible to effectively prevent short circuit and interference from external signals.

With continued reference to FIG. 3, the sampling and signal processing unit 212 can acquire the resistance value of the thermistor (e.g. a positive temperature coefficient thermistor NTC) through the sampling line Sampling5, and obtain the detected temperature value of the shunt according to the resistance value of the NTC and the relationship between the resistance value of the NTC and the temperature. The sampling and signal processing unit 212 may input the detected temperature value into the isolation CAN communication unit 213 and the CAN interface 31 and transmit the detected temperature value to the management unit 10, so that the management unit 10 can perform temperature compensation for the shunt based on the detected temperature value.

With continued reference to FIG. 3, in some embodiments, magnetic field gathering devices may be disposed at both ends of the current sensing device having the magnetic field sensitive element, respectively. By way of example, the detection of the current data through the magnetic field gathering devices and the current sensing devices having the magnetic field sensitive element will be described in detail below.

In an example, the current sensing device 221 having the magnetic field sensitive element may be a Hall element. In the embodiment, Sampling3 is a sampling line at one end of the Hall element and a sampled voltage $U_{SP3}$ at one end of the Hall element can be acquired via the sampling line Sampling3; Sampling4 is a sampling line at the other end of the Hall element and a sampled voltage $U_{SP4}$ at the other end of the Hall element can be acquired via the sampling line Sampling4.

In the embodiment, assume that the distance between the two sampling ends of the Hall element is d, the electron charge is q, the electron motion speed is v, the vertical distance between the shunt and the Hall element is a, the length of the shunt is m, the straight line distance between the Hall element and both ends of the shunt is r (i.e., the Hall element is located at the center position relative to the shunt, so the distance between the Hall element and each end of the shunt is r), the magnetic field strength after the process of the magnetic field gathering device is set to B, the vacuum permeability is a constant $u_0$, the electric field force is $F_E$, and the Lorentz force is $F_L$.

Assume that $I_{Hall}$ is the detected current by use of the Hall element, the formulas (2), (3) and (4) can be listed as follows.

$$B = \frac{u_0 m I_{Hall}}{4\pi ar} \qquad (2)$$

$$F_L = Bqv \qquad (3)$$

$$F_E = Eq \qquad (4)$$

Based on the above formulas (2), (3) and (4), the magnetic field strength B after the process of the magnetic field gathering devices, the electric field force $F_E$, and the Lorentz force $F_L$ can be obtained respectively.

When the current $I_{Hall}$ flows through the shunt, an electromagnetic field with a magnetic field strength of B can be generated by the magnetic field gathering device. The electrons in the hall element are affected by the Lorentz force $F_L$ and will be gathered on one end of the Hall element. In this case, the other end of the Hall element may present a positive state, and then an electric field of intensity E may be generated. When the Lorentz force and the electric field force balance, the electrons will no longer drift. At this time, a steady state is achieved, and a stable potential (i.e., a stable voltage difference) is produced across the Hall element.

Particularly, the steady state when the Lorentz force and the electric field force balance can be represented by the following formula (5).

$$F_L = F_E \qquad (5)$$

By combining the above formulas (3), (4) and (5), the electric field intensity E can be obtained as represented by the following formula (6).

$$E = Bv = \frac{u_0 m v I_{Hall}}{4\pi ar} \qquad (6)$$

According to the formula of the electric field intensity, the electric field intensity E can also be obtained as represented by the following formula (7).

$$E = \frac{|U_{SP3} - U_{sp4}|}{d} \qquad (7)$$

By combining the formulas (6) and (7), the current data of the power battery pack to be detected to be acquired by the Hall element can be calculated according to the following formula (8).

$$I_{Hall} = \frac{4\pi ar |U_{SP1} - U_{sp2}|}{u_0 m v d} \qquad (8)$$

In the above formula (8), a represents the vertical distance between the shunt and the Hall element, r represents the straight line distance between the Hall element and both ends of the shunt, $u_0$ represents the vacuum permeability, d represents the distance between the two sampling ends of the Hall element, v represents the electron motion speed and m represents the length of the shunt.

With continued reference to FIG. 3, in an embodiment, the current detection system may further include the analog interface 33 for transmitting the amplified current signal as measured by the magnetic field sensitive element.

In the embodiment of the present disclosure, the open-loop Hall-type current measurement unit can be used as an auxiliary part of the circuit for detecting the power battery pack to be detected, since the open-loop Hall-type current measurement has the advantages of low power consumption and low cost. When the shunt-type current measurement unit fails, the open-loop Hall-type current measurement unit can be used for fault diagnosis, and meanwhile temporarily perform current measurement on the current of the power battery pack, thereby increasing the reliability of the entire system.

Figure 4:
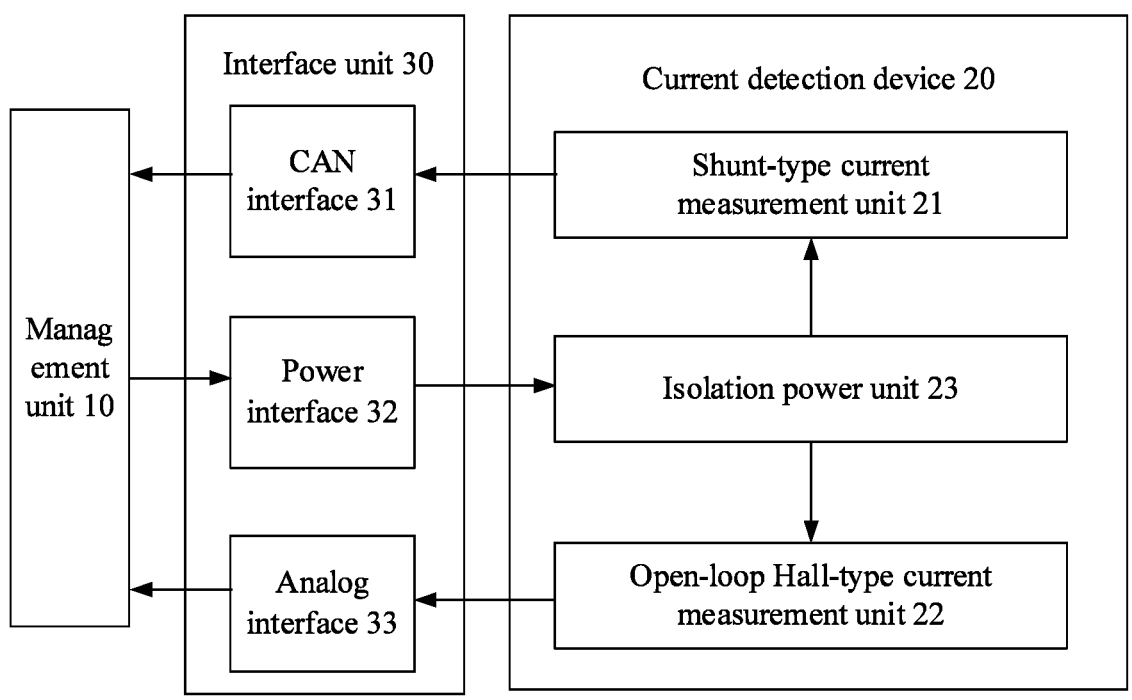
FIG. 4 is a schematic diagram of a current detection device according to an embodiment of the present disclosure.

FIG. 4 is a schematic block diagram of a current detection device according to an embodiment of the present disclosure. The same or equivalent units in FIG. 4 as those in FIG. 2 are denoted by the same reference numerals. As shown in FIG. 4, the current detection device 20 may include a shunt-type current measurement unit 21, an open-loop Hall-type current measurement unit 22, and an isolation power unit 23.

In the embodiment, the interface unit 30 may include a CAN interface 31, a power interface 32, and an analog interface 33.

The shunt-type current measurement unit 21 may be configured to measure a current value of a power battery pack with a current sensing device having a shunt resistor and transmit the current value as measured by the current sensing device having the shunt resistor to the CAN interface 31.

The open-loop Hall-type current measurement unit 22 may be configured to measure the current value of the power battery pack with a current sensing device having a magnetic field sensitive element and transmit the current value as measured by the current sensing device having the magnetic field sensitive element to the analog interface 33.

The isolation power unit 23 may be configured to electrically isolate an input power from the power interface 32 and convert a voltage supplied by the input power into operating voltages of the shunt-type current measurement unit 21 and the open-loop Hall-type current measurement unit 22.

In the embodiment of the present disclosure, an interface circuit with good compatibility may be utilized, including a common CAN interface, a power interface, and an analog interface. In different applications, the BMU only needs to reserve a corresponding interface to be fully compatible.

The embodiment of the present disclosure provides a current detection device. The current detection device may be connected to a management unit (e.g., the battery management unit BMU of the battery management system BMS) through the interface unit 30. Under the control of the battery management unit BMU, it is possible to perform current detection and fault diagnosis on the power battery pack to be detected.

Other details of the current detection device according to the embodiment of the present disclosure are similar to those of the current detection system according to embodiments of the present disclosure described above with reference to FIG. 1 to FIG. 3, and are not described herein again.

Figure 5:
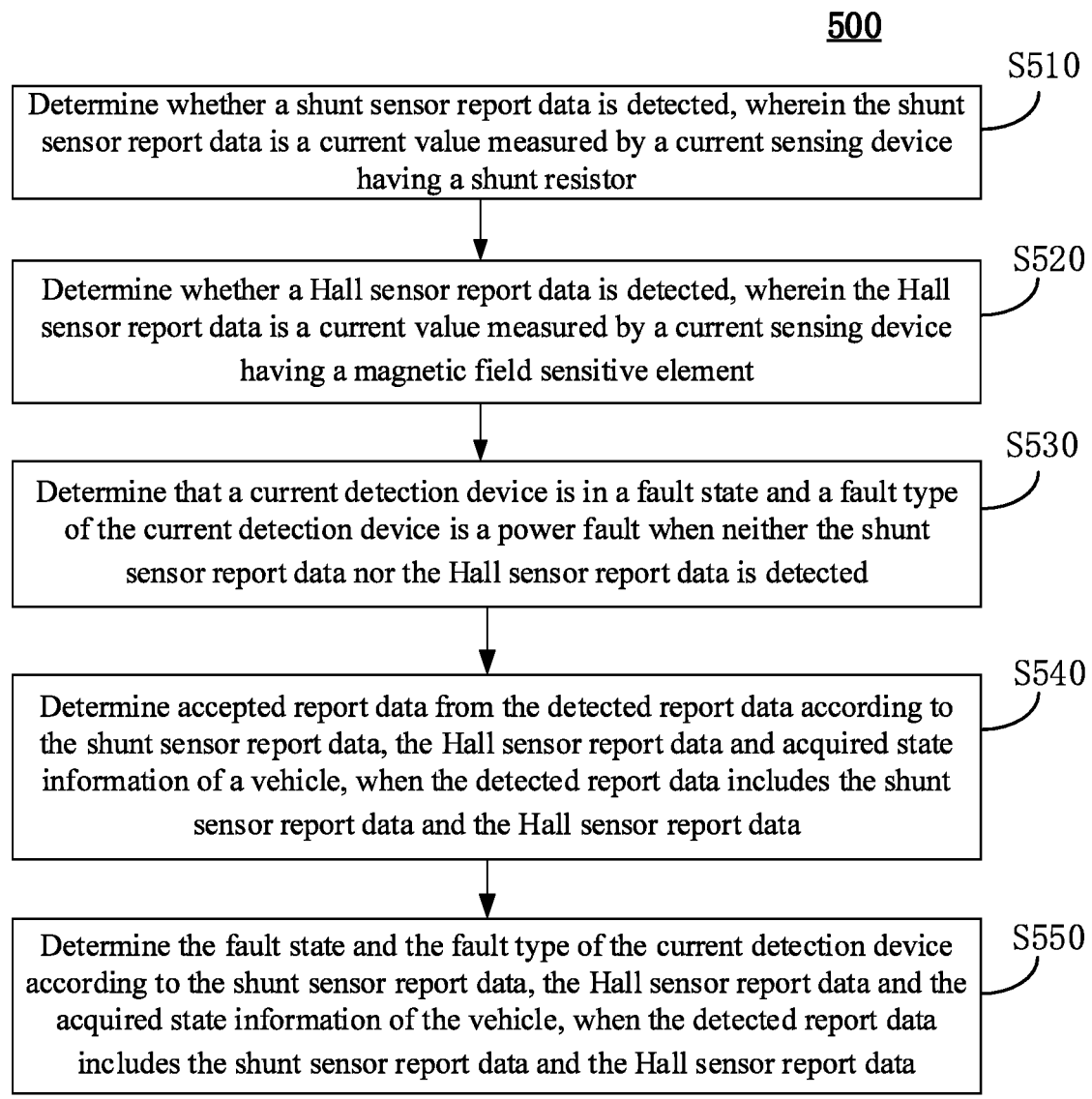
FIG. 5 is a flowchart of a current detection method according to an embodiment of the present disclosure.

A current detection method according to an embodiment of the present disclosure will be described below with reference to FIG. 5. FIG. 5 shows a flowchart of the current detection method according to the embodiment of the present disclosure.

As shown in FIG. 5, the current detection method according to the embodiment of the present disclosure may include the following steps S510 to S540.

At step S510, it may be determined whether a shunt sensor report data is detected, wherein the shunt sensor report data is a current value measured by a current sensing device having a shunt resistor.

At step S520, it may be determined whether a Hall sensor report data is detected, wherein the Hall sensor report data is a current value measured by a current sensing device having a magnetic field sensitive element.

At step S530, it may be determined that a current detection device is in a fault state and a fault type of the current detection device is a power fault when neither the shunt sensor report data nor the Hall sensor report data is detected, wherein the current detection device includes the current sensing device having the shunt resistor and the current sensing device having the magnetic field sensitive element.

At step S540, when the detected report data includes the shunt sensor report data and the Hall sensor report data, accepted report data from the detected report data may be determined according to the shunt sensor report data, the Hall sensor report data and acquired state information of a vehicle.

In the embodiment of the present disclosure, the current sensing device having the shunt resistor serves as a main current acquisition unit, and the current sensing device having the magnetic field sensitive element serves as an auxiliary current acquisition unit. With the current detection method according to the embodiment of the present disclosure, when a battery detection system is in a normal state or in a fault state, the accepted report data may be determined as the detected current of the power battery pack to be detected, according to the shunt sensor report data and the Hall sensor report data. Thus the stability of the current detection system can be enhanced, and the current acquisition process can be more reliable.

In an embodiment, the step S540 of determining the accepted report data from the detected report data may particularly include the following steps S541 to S542.

At S541, it may be determined that the accepted report data is the shunt sensor report data when the shunt sensor report data coincides with the state information of the vehicle.

At S542, it may be determined that the accepted report data is the Hall sensor report data when the shunt sensor report data does not coincide with the state information of the vehicle but the Hall sensor report data coincides with the state information of the vehicle.

In an embodiment, the current detection method 500 may further include step S550. At step S550, when the detected report data includes the shunt sensor report data and the Hall sensor report data, the fault state and the fault type of the current detection device may be determined according to the shunt sensor report data, the Hall sensor report data and the acquired state information of the vehicle.

In an embodiment, the step S550 may include step S551. At step S551, it may be determined that the current detection device is in the fault state and the fault type is a mechanical fault of a shunt sensor, when the shunt sensor report data does not coincide with the state information of the vehicle but the Hall sensor report data coincides with the state information of the vehicle.

As an example, the mechanical fault of the shunt sensor may be that a conductive wire on the outside of the shunt sensor is not connected.

In an embodiment, the step S550 may include step S552. At step S552, it may be determined that the current detection device is in the fault state and the fault type is a circuit fault of the shunt sensor, when the shunt sensor report data does not coincide with the state information of the vehicle and the Hall sensor report data does not coincide with the state information of the vehicle.

In the step, when the Hall sensor report data does not coincide with the state information of the vehicle, the mechanical fault of the shunt sensor may be excluded. As an example, the circuit fault of the shunt sensor may be a functional fault or a related chip fault of the sampling and signal processing unit.

The current detection method according to the embodiment of the present disclosure can solve the problem that a single current detection solution cannot diagnose the detection fault. In embodiments of the present disclosure, the shunt-type current measurement unit serves as a main part for performing accurate current measurement, while the Hall-type current measurement unit serves as an auxiliary part. The two signal processing parts are independent of each other. Therefore, when the SHUNT-type current acquisition fails, the SHUNT-type current can be diagnosed according to the HALL-type measurement.

Figure 6:
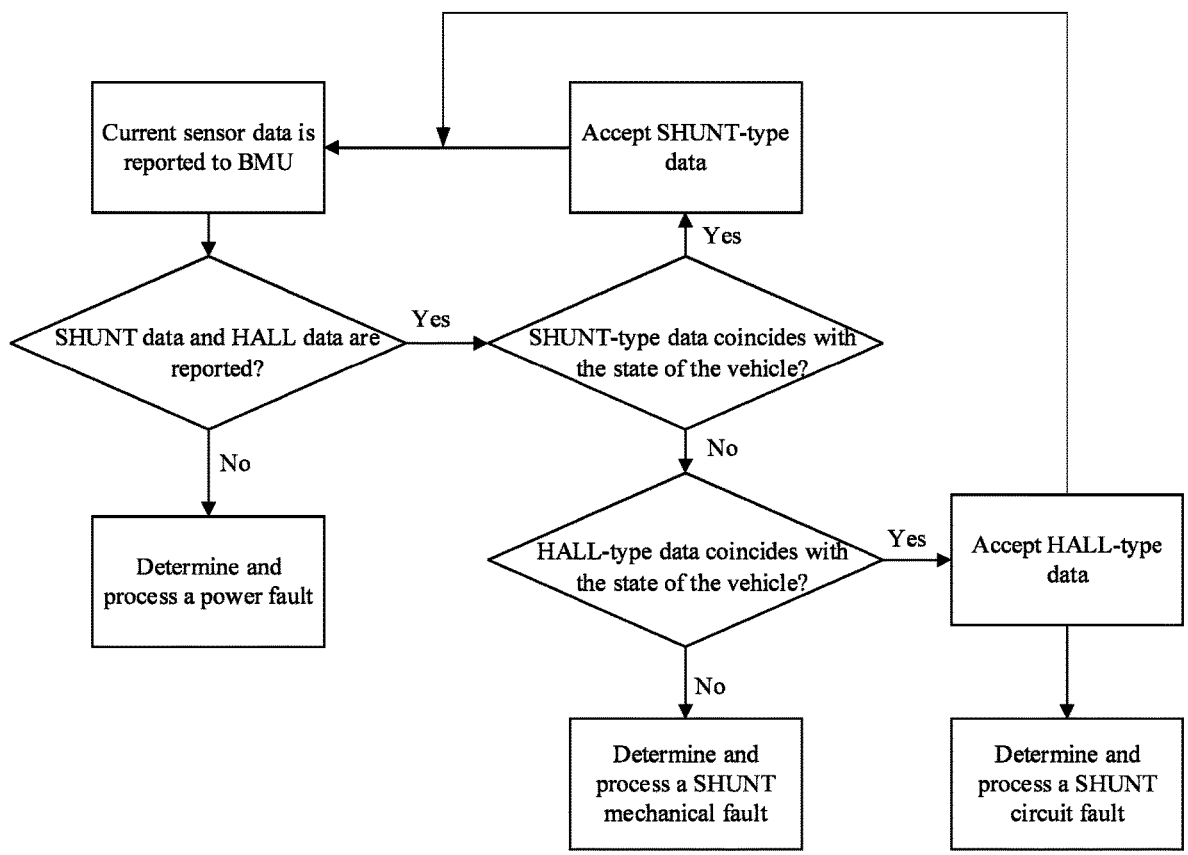
FIG. 6 is a flowchart of a current detection method according to another embodiment of the present disclosure.

For ease of understanding, a current detection method according to another embodiment of the present disclosure will be described below with reference to FIG. 6. FIG. 6 shows a flowchart of the current detection method according to the embodiment of the present disclosure.

As an example, the current sensing device having the shunt resistor is a SHUNT sensor, and the current sensing device having the magnetic field sensitive element is a HALL sensor.

First, the current of the power battery pack may be acquired by the SHUNT sensor and the HALL sensor respectively.

Next, assume that the current data acquired by the SHUNT sensor is referred to as SHUNT-type data and the current data acquired by the HALL sensor is referred to as HALL-type data, then the battery management unit may determine whether both the SHUNT-type data and the HALL-type data are simultaneously detected, that is, whether both the SHUNT-type data and the HALL-type data are simultaneously reported.

When the SHUNT-type data and the HALL-type data are not simultaneously reported, it may be determined that the current detection system is in the fault state and the fault type is a power fault.

When the SHUNT-type data and the HALL-type data are simultaneously reported, the following processing may be performed on the SHUNT-type data and the HALL-type data.

It may be determined whether the SHUNT-type data coincides with the state of the vehicle. If the SHUNT-type data coincides with the state of the vehicle, then the BMU accepts the SHUNT-type data. If the SHUNT-type data does not coincide with the state of the vehicle, it may be further determined whether the HALL-type data coincides with the state of the vehicle. If the HALL-type data coincides with the state of the vehicle, then the BMU may accept the HALL-type data and determine that the current measurement unit including the SHUNT sensor has a circuit fault. If the HALL-type data does not coincide with the state of the vehicle, it may be determined that the SHUNT sensor has a mechanical fault.

In the embodiment, after the current detection device is powered on, the current sensor can report the current data directly. According to whether the BMU can detect two kinds of current signals, a first fault diagnosis can be performed. If the two kinds of current signals cannot be detected, it may be determined that a power fault occurs, the fault may be reported and preset actions may be executed. If the two kinds of current signals can be detected, then a next diagnosis may be performed.

That is, if the two kinds of current signals can be detected, it may be determined whether the SHUNT-type data coincides with the state of the vehicle. That is, when the vehicle stops, accelerates or is charged, it may be determined whether the measured current data coincides with actual data. If the measured current data coincides with the actual data, the BMU accepts the SHUNT-type data. If the measured current data does not coincide with the actual data, then the next diagnosis may be performed.

That is, if the SHUNT-type data does not coincide with the state of the vehicle, it may be determined whether the HALL-type data coincides with the state of the vehicle. If the HALL-type data coincides with the state of the vehicle, then the BMU may accept the HALL-type data, report a SHUNT circuit fault and execute preset actions. If the HALL-type data does not coincide with the state of the vehicle, then the BMU may report a SHUNT mechanical fault and execute preset actions.

In the embodiment of the present disclosure, after the SHUNT-type current sensor fails, the measurement result of the HALL-type current sensor may be temporarily used as the measurement result of the PACK current to be provided to the BMU. Therefore, it is possible to solve the problem that the current data cannot be provided after the SHUNT-type current sensor fails.

The above embodiments may be implemented entirely or partly by software, hardware, firmware or any combination thereof. When it is implemented by software, it may be entirely or partly implemented as a computer program product or a computer readable storage medium. The computer program product or the computer readable storage medium includes one or more computer instructions. When the computer program instructions are loaded and executed on a computer, they entirely and partly produce the flowchart or functions described in the embodiments of the present disclosure. The computer may be a general purpose computer, a special purpose computer, a computer network, or another programmable apparatus. The computer instructions may be stored in the computer readable storage medium or may be transmitted from a computer readable storage medium to another computer readable storage medium. For example, the computer instructions may be transmitted by wire (for example, coaxial cable, optical fiber, digital subscriber line (DSL)) or wireless (for example, infrared, radio, microwave and so on) from a website, computer, server or data center to another website, computer, server or data center. The computer readable storage medium may be any applicable medium accessible by the computer or a data storage device such as a server or a data center integrated with one or more applicable media. The applicable medium may be a magnetic medium (for example, a soft disk, a hard disk, a magnetic tape), an optical medium (for example, a DVD) or a semiconductor medium (for example, a solid state disk (SSD)) and so on.

It is to be understood that the embodiments of the present disclosure are not limited to the specific configurations and processes described above and shown in the drawings. Also, for the purpose of concision, the detailed description of known technique is omitted herein. In the above embodiments, a number of specific steps are described and illustrated as examples. However, the processes of the embodiments of the present disclosure are not limited to the specific steps described and illustrated. A person skilled in the art may make various changes, modifications and additions, or change the order of the steps after understanding the spirit of the present disclosure.

The above description is only for illustrating the specific embodiments of the present disclosure. It will be apparent to those skilled in the art that, for the sake of convenience and simplicity of description, specific operating processes of the systems, units and elements described above may be known by referring to corresponding processes in the foregoing method embodiments, and will not be repeated herein. It is to be understood that the scope of the present disclosure is not limited thereto. Within the technical scope of the present disclosure, various modifications or substitutions may be readily apparent to those skilled in the art, and all of the modifications or substitutions are to be included within the scope of the present disclosure.

What is claimed is:

1. A current detection system, comprising a management unit and a current detection device that is connected with the management unit, wherein:
    the current detection device comprises a shunt-type current measurement unit, an open-loop Hall-type current measurement unit and an isolation power unit;
    the shunt-type current measurement unit is configured to measure a current value of a power battery pack with a current sensing device having a shunt resistor;
    the open-loop Hall-type current measurement unit is configured to measure a current value of the power battery pack with a current sensing device having a magnetic field sensitive element;
    the isolation power unit is configured to electrically isolate a power supply provided by the management unit and convert a voltage from the power supply into operating voltages of the shunt-type current measurement unit and the open-loop Hall-type current measurement unit; and
    the management unit is configured to receive the current value measured by the current sensing device having the shunt resistor and the current value measured by the current sensing device having the magnetic field sensitive element, and perform a fault detection on the current detection device,
    wherein the shunt-type current measurement unit comprises:
    the current sensing device having the shunt resistor, configured to acquire a voltage signal of the power battery pack and output the voltage signal via a signal terminal of the current sensing device having the shunt resistor;
    a sampling and signal processing device, configured to acquire the voltage signal and calculate the current value of the power battery pack with the voltage signal and a resistance value of the shunt resistor; and
    an isolation Controller Area Network CAN communication unit, configured to electrically isolate the current sensing device having the shunt resistor and the sampling and signal processing device, convert the calculated current value of the power battery pack into a current value that conforms to a CAN specification, and transmit the current value that conforms to the CAN specification to a CAN interface via a CAN bus, wherein the CAN interface comprises a CAN high-voltage line interface and a CAN low-voltage line interface.

2. The current detection system of claim 1, further comprises the CAN interface configured to output the current value on the CAN bus in a manner of differential signal transmission through the CAN high-voltage line interface and the CAN low-voltage line interface.

3. The current detection system of claim 1, wherein the shunt-type current measurement unit further comprises a temperature acquisition unit that includes a thermistor;
    the temperature acquisition unit is configured to detect a temperature value of the current sensing device having the shunt resistor by utilizing the characteristic of the thermistor having a resistance value that changes with temperature; and
    the management unit is further configured to receive the detected temperature value and perform temperature compensation for the current sensing device having the shunt resistor based on the temperature value.

4. The current detection system of claim 1, wherein the open-loop Hall-type current measurement unit comprises:
    the current sensing device having the magnetic field sensitive element, configured to measure a current signal of the power battery pack with the magnetic field sensitive element;
    an isolation operational amplifier configured to electrically isolate the current sensing device having the magnetic field sensitive element, and amplify the current signal measured by the magnetic field sensitive element by use of a measurement amplifier circuit.

5. The current detection system of claim 1, further comprising:
    an analog interface configured to transmit the amplified current signal as measured by the magnetic field sensitive element.

6. The current detection system of claim 1, further comprising a power interface that includes a low-voltage DC power interface and a low-voltage ground interface, wherein:
    the low-voltage DC power interface is configured to output a low-voltage DC power to the isolation power unit;
    the low-voltage ground interface is configured to ground the shunt-type current measurement unit, the open-loop Hall-type current measurement unit and the isolation power unit at a low voltage.

7. The current detection system of claim 1, wherein:
    the management unit is a battery management unit BMU;
    the current sensing device having the shunt resistor is a shunt sensor;
    the current sensing device having the magnetic field sensitive element is a Hall sensor.

8. A current detection method, comprising:
    determining whether a shunt sensor report data is detected, wherein the shunt sensor report data is a current value measured by a current sensing device having a shunt resistor;
    determining whether a Hall sensor report data is detected, wherein the Hall sensor report data is a current value measured by a current sensing device having a magnetic field sensitive element;
    determining that a current detection device is in a fault state and a fault type of the current detection device is a power fault when neither the shunt sensor report data nor the Hall sensor report data is detected, wherein the current detection device comprises the current sensing device having the shunt resistor and the current sensing device having the magnetic field sensitive element; and determining accepted report data from the detected report data according to the shunt sensor report data, the Hall sensor report data and acquired state information of a vehicle, when the detected report data includes the shunt sensor report data and the Hall sensor report data, wherein the determining accepted report data from the detected report data according to the shunt sensor report data, the Hall sensor report data and acquired state information of a vehicle comprises:

determining that the accepted report data is the shunt sensor report data when the shunt sensor report data coincides with the state information of the vehicle; and determining that the accepted report data is the Hall sensor report data when the shunt sensor report data does not coincide with the state information of the vehicle but the Hall sensor report data coincides with the state information of the vehicle.

9. The current detection method of claim 8, further comprising:

determining the fault state and the fault type of the current detection device according to the shunt sensor report data, the Hall sensor report data and the acquired state information of the vehicle, when the detected report data includes the shunt sensor report data and the Hall sensor report data.

10. The current detection method of claim 9, wherein the determining the fault state and the fault type of the current detection device according to the shunt sensor report data, the Hall sensor report data and the acquired state information of the vehicle comprises:

determining that the current detection device is in the fault state and the fault type is a mechanical fault of a shunt sensor, when the shunt sensor report data does not coincide with the state information of the vehicle but the Hall sensor report data coincides with the state information of the vehicle.

11. The current detection method of claim 9, wherein the determining the fault state and the fault type of the current detection device according to the shunt sensor report data, the Hall sensor report data and the acquired state information of the vehicle comprises:

determining that the current detection device is in the fault state and the fault type is a circuit fault of a shunt sensor, when neither the shunt sensor report data nor the Hall sensor report data coincides with the state information of the vehicle.

12. A current detection device comprising a shunt-type current measurement unit, an open-loop Hall-type current measurement unit, an isolation power unit and an interface unit, wherein:

the interface unit includes a power interface, a Controller Area Network CAN interface and an analog interface;

the shunt-type current measurement unit is configured to measure a current value of a power battery pack with a current sensing device having a shunt resistor and transmit the current value as measured by the current sensing device having the shunt resistor to the CAN interface;

the open-loop Hall-type current measurement unit is configured to measure the current value of the power battery pack with a current sensing device having a magnetic field sensitive element and transmit the current value as measured by the current sensing device having the magnetic field sensitive element to the analog interface; and the isolation power unit is configured to electrically isolate an input power from the power interface and convert a voltage supplied by the input power into operating voltages of the shunt-type current measurement unit and the open-loop Hall-type current measurement unit, wherein the shunt-type current measurement unit comprises:

the current sensing device having the shunt resistor, configured to acquire a voltage signal of the power battery pack and output the voltage signal via a signal terminal of the current sensing device having the shunt resistor;

a sampling and signal processing device, configured to acquire the voltage signal and calculate the current value of the power battery pack with the voltage signal and a resistance value of the shunt resistor; and an isolation Controller Area Network CAN communication unit, configured to electrically isolate the current sensing device having the shunt resistor and the sampling and signal processing device, convert the calculated current value of the power battery pack into a current value that conforms to a CAN specification, and transmit the current value that conforms to the CAN specification to the CAN interface via a CAN bus, wherein the CAN interface comprises a CAN high-voltage line interface and a CAN low-voltage line interface.

* * * * *